United States Patent
Reymond et al.

(10) Patent No.: US 8,508,218 B2
(45) Date of Patent: Aug. 13, 2013

(54) HALL-EFFECT-BASED ANGULAR ORIENTATION SENSOR AND CORRESPONDING METHOD

(75) Inventors: Serge Reymond, Geneva (CH); Pavel Kejik, Ecublens (CH)

(73) Assignee: Sensima Technology SA, Gland (CH)

( * ) Notice: Subject to any disclaimer, the term of this patent is extended or adjusted under 35 U.S.C. 154(b) by 293 days.

(21) Appl. No.: 13/105,533

(22) Filed: May 11, 2011

(65) Prior Publication Data

US 2012/0286773 A1    Nov. 15, 2012

(51) Int. Cl.
    *G01B 7/14*  (2006.01)
(52) U.S. Cl.
    USPC .............. 324/207.2; 324/207.23; 324/251
(58) Field of Classification Search
    None
    See application file for complete search history.

(56) References Cited

U.S. PATENT DOCUMENTS

| | | | | |
|---|---|---|---|---|
| 4,013,946 A | * | 3/1977 | Lewis | 324/247 |
| 7,834,620 B2 | * | 11/2010 | Kejik et al. | 324/253 |
| 8,324,891 B2 | * | 12/2012 | Kejik et al. | 324/207.22 |

FOREIGN PATENT DOCUMENTS

| | | |
|---|---|---|
| EP | 2028450 | 2/2009 |
| WO | 2008/145662 | 12/2008 |

* cited by examiner

*Primary Examiner* — Minh N Tang
(74) *Attorney, Agent, or Firm* — Rankin, Hill & Clark LLP

(57) ABSTRACT

A method for sensing an angular orientation of a magnetic field includes providing a set of $N \geq 2$ Hall effect devices, each having a detection direction and including two pairs of connectors; providing at least one band pass filter having a fundamental frequency $f=1/Tf$; providing at least one current source for outputting an electrical current at its output; applying, during a first time period of a duration 0.5 Tf and in a specific sequence of the N Hall effect devices, to each of the N Hall effect devices a respective wiring scheme Wi+, during respective subsequent time periods of durations ti; and applying, during a second time period of a duration 0.5 Tf, subsequent to the first time period of a duration 0.5 Tf, and in the same specific sequence of the N Hall effect devices, to each of the N Hall effect devices a respective wiring scheme Wi−, during respective subsequent time periods of the same durations ti.

20 Claims, 7 Drawing Sheets

HALL-EFFECT-BASED ANGULAR ORIENTATION SENSOR AND CORRESPONDING METHOD

TECHNICAL FIELD

The invention relates to the field of sensing the angular orientation of a magnetic field by means of the Hall effect. In particular, the invention relates to a sensor for sensing an angular orientation of a projection of a magnetic field vector of a magnetic field into a plane and to a method for sensing an angular orientation of a projection of a magnetic field vector of a magnetic field into a plane.

It relates to methods and apparatuses according to the opening clauses of the claims. Corresponding devices find application in many areas, e.g., in position sensing and in rotation speed measuring, e.g., in automotive and aircraft industry.

BACKGROUND OF THE INVENTION

In the state of the art, several ways of determining the angular orientation of a magnetic field using the Hall effect are known. In many cases, it is sufficient to restrict to an orientation within a plane, i.e. to determine the angular orientation of a the projection of the magnetic field into that plane.

For example, it is known to use two orthogonally arranged Hall devices and convert their respective Hall voltages into a digital number using analog-digital converters. The angle representing the wanted angular orientation is then derived by calculating the inverse tangent (arc tangent, ATAN) of the ratio of these two numbers, wherein typically a digital controller such as a microcontroller computes the ATAN function using either a CORDIC algorithm or a lookup table.

This solution has several rather undesirable consequences. A relatively high amount of energy is consumed, since two analog-digital converters and usually also a microcontroller are involved. And a microcontroller generally introduces a time delay, and in particular, the time needed for initializing the microcontroller will add up to the delay. Furthermore, the microcontroller is software-controlled, and in some applications such as in aircraft industry, the use of software in a sensor system requires a special and relatively tough qualification procedure.

In order to be able to dispense with the analog-digital conversion of two signals, phase-sensitive systems have been suggested. They are typically configured in such a way that at the output of the sensors a sine signal is obtained the phase of which represents the angle to be measured. The advantage is that the signal can be fed to a simple phase detection circuit for obtaining the desired angle. Various methods for generating a signal the phase of which contains the desired angular information have already been proposed.

E.g., in EP 2 028 450 A2, the desired signal is generated by summing up the outputs of two orthogonally arranged Hall effect devices (one of the devices being inclined with respect to the other by an angle of 90°). For accomplishing this, the Hall effect devices are provided with bias currents of sine shape which have identical amplitudes and are shifted by 90° with respect to each other. The generation of the required sine wave currents is relatively challenging and costly, and if the phase shift is not exactly 90° and/or if the amplitude of the sine waves is not equal, the outputted angular information does not precisely reflect the magnetic field orientation.

Another method is disclosed in WO 2008/145 662 A1. Therein, it is suggested to provide a particular sensing structure which can be considered a circular vertical Hall device which naturally produces a sine wave output. From the sine signal, a PWM signal proportional to the angle can be readily obtained. The manufacture of the required special Hall device is relatively costly, and the time required for a measurement is relatively long.

It is desirable to provide an improved way of determining the angular orientation of a magnetic field projected in a plane.

SUMMARY OF THE INVENTION

Therefore, one object of the invention is to create an improved way of determining the angular orientation of a magnetic field projected in a plane, in particular a way that does not have the disadvantages mentioned above.

A corresponding sensor, more particularly a sensor for sensing an angular orientation of a projection of a magnetic field vector of a magnetic field into a plane, shall be provided, and in addition, the respective method shall be provided, more particularly the respective method for sensing an angular orientation of a projection of a magnetic field vector of a magnetic field into a plane.

Another object of the invention is to provide a way of determining the angular orientation of a magnetic field projected in a plane which is implemented relatively easily.

Another object of the invention is to provide a way of determining the angular orientation of a magnetic field projected in a plane which yields particularly accurate results.

Another object of the invention is to provide a suitable sensor having a good manufacturability.

Another object of the invention is to provide a particularly energy-efficient way of determining the angular orientation of a magnetic field projected in a plane.

Another object of the invention is to provide a relatively simple way of determining the angular orientation of a magnetic field projected in a plane, in particular by dispensing with complex components or procedures.

Another object of the invention is to provide a particularly fast way of determining the angular orientation of a magnetic field projected in a plane.

Further objects emerge from the description and embodiments below.

At least one of these objects is at least partially achieved by apparatuses and methods according to the patent claims.

The sensor for sensing an angular orientation of a projection of a magnetic field vector of a magnetic field into a plane comprises
- at least a first set of $N \geq 2$ Hall effect devices, each having a detection direction and comprising two pairs of connectors, wherein, in presence of said magnetic field, a flow of an electric current between the connectors of any of said pairs of connectors allows to pick up (or measure) a Hall voltage between the connectors of the other respective pair of connectors induced by said magnetic field, unless a magnetic field component of said magnetic field along said detection direction is zero, wherein said N Hall effect devices are aligned such that their detection directions lie in said plane, and wherein at least two of said Hall effect devices have non-identical detection directions;
- at least one filtering-or-resonating unit comprising an input and an output, wherein a signal outputted from said output is referred to as filtered signal;

at least one current source comprising an output for outputting an electrical current at its output;

a wiring unit operationally connected to each of said connectors of each of said N Hall effect devices structured and configured for selectively wiring said pairs of connectors to said output of said current source or to said input of said filtering-or-resonating unit, wherein a particular way of wiring both pairs of connectors of a Hall effect device is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;

a control unit structured and configured for controlling said wiring unit in such a way that during a first time period of a duration 0.5 Tf and in a specific sequence of said N Hall effect devices, to each of said N Hall effect devices a respective wiring scheme Wi+ is applied, i=1, ..., N, during respective subsequent time periods of durations ti, i=1, ..., N; and during a second time period of a duration 0.5 Tf, subsequent to said first time period of a duration 0.5 Tf, and in the same specific sequence of said N Hall effect devices, to each of said N Hall effect devices a respective wiring scheme Wi− is applied, i=1, ..., N, during respective subsequent time periods of the same durations ti, i=1, ..., N;

wherein each of said wiring schemes Wi+ is an orthogonal and reverse wiring scheme of the respective other wiring scheme Wi−, i=1, ..., N;

an output unit operationally connected to said output of said filtering-or-resonating unit structured and configured for obtaining from a filtered signal an output signal indicative of said angular orientation and outputting said signal;

wherein said filtering-or-resonating unit is structured and configured for altering an inputted signal of a fundamental frequency f=1/Tf, said inputted signal containing, in addition to said fundamental frequency, higher harmonics, in such a way that an intensity of said higher harmonics is decreased relative to an intensity of said fundamental frequency.

Such a sensor makes it possible to sense an angular orientation of a projection of a magnetic field vector of a magnetic field into a plane in high precision while using relatively simple components only. Such a sensor can be constructed in a relatively simple way without lacking measuring accuracy. In addition, such a sensor can be realized in Silicon using solely CMOS processes. The use of Hall effect devices which are orthogonal to each other allows to cancel (or at least strongly reduce) offsets. Such an offset in a Hall effect device means that although no magnetic field is present (B=0), a non-zero Hall voltage is present (VHall≠0).

It is well possible to realized such a sensor by means of vertical Hall effect devices.

In an attempt to better understand the invention, one can say that the N Hall effect devices are read out and provided with bias current in such a way that the read out sequence of Hall voltages mimics a sine wave, the sine wave having the frequency f, and the mimicking is realized in form of a step-function, in form of a staircase signal. The filtering-or-resonating unit emphasizes the (fundamental) frequency f while suppressing other frequencies, in particular unavoidably occurring higher harmonics. And from the phase of the resulting sine or sine-like wave, the wanted angular orientation is derived, which is usually accomplished by means of a simple phase detecting. Each of said time periods of duration 0.5 T can be related to a half-wave of the sine wave, wherein said time periods do not necessarily start at 0° or 180°.

The number N is positive integer, amounting to at least 2.

With respect to the term 0.5 Tf, it is to be noted that this is not to be understood as 0.50000 Tf or exactly 0.5 Tf. The larger the deviation from exactly 0.5 Tf, the higher will be a distortion introduced in the signal outputted by the filtering-or-resonating unit and the output signal, respectively. Usually, for first and second time spans of 0.5 Tf, the duration will be between 0.45 Tf and 0.55 Tf or rather between 0.47 Tf and 0.53 Tf, for better results between 0.49 Tf and 0.51 Tf.

Something similar applies to the durations ti, i=1, ..., N, which are not necessarily exactly identical in the first and second time spans of 0.5 Tf, but may deviate by as much as ±5% or ±10%, preferably only up to ±2%.

But the sum over all ti (i.e. for i=1, ..., N) amounts to the before-addressed 0.5 Tf.

The applied current can also be referred to as bias current.

Said plane usually is a predetermined plane, usually given by the orientation in space of the sensor, or more particularly of the N Hall effect devices.

In one embodiment, the sensor comprises exactly one filtering-or-resonating unit.

Said fundamental frequency can usually be referred to as a filter frequency or a resonance frequency.

The altering accomplished in said filtering-or-resonating unit is usually a filtering.

In one embodiment which may be combined with the above-mentioned embodiment, said filtering-or-resonating unit is or comprises a band pass filter.

In one embodiment which may be combined with one or more of the above-addressed embodiments, said filtering-or-resonating unit is or comprises a low pass filter, in particular, it comprises in addition an offset remover for removing any DC offsets, i.e. for removing voltages at 0 Hz.

In one embodiment which may be combined with one or more of the before-addressed embodiments, said filtering-or-resonating unit comprises an amplifier, in particular an input amplifier for amplifying the Hall voltages before accomplishing the signal altering/signal filtering.

In one embodiment which may be combined with one or more of the before-addressed embodiments, the sensor comprises exactly one current source or exactly two current sources, in particular exactly one current source.

In one embodiment which may be combined with one or more of the before-addressed embodiments, the current outputted by the current source is a predetermined electrical current.

In one embodiment which may be combined with one or more of the before-addressed embodiments, the current outputted by the current source is an adjustable electrical current.

In one embodiment which may be combined with one or more of the before-addressed embodiments, to each of the N Hall effect devices, a bias current of the same amperage is applied.

In one embodiment which may be combined with one or more of the before-addressed embodiments, to each of said N Hall effect device, pulses of constant current are applied.

In one embodiment which may be combined with one or more of the before-addressed embodiments, constant currents are applied during measuring times, i.e. during times when a Hall voltage is fed from the respective Hall effect device to the filtering unit.

Usually, the at least one current source is capable of outputting constant currents, in particular such constant currents which can be used as bias currents.

In one embodiment which may be combined with one or more of the before-addressed embodiments, the current applied to the i-th of said N Hall effect devices during said first time period of duration 0.5 Tf (first half-wave)—no matter if the current is constant or time-dependent—must be the same as applied to this i-th of said N Hall effect device during said second time period of duration 0.5 Tf (second half-wave).

Where the term "subsequent" and "subsequently", respectively, is used, this usually means that something follows immediately afterwards, i.e. without or with negligible delay.

With respect to said detection direction, it is to be noted that this is not a directed object, as it does not have a sense of direction like an arrow; it is rather an object like a line.

Said "wiring a pair of connectors to said output of said current source" usually results in application of a current (bias current) to the respective Hall device; and the "wiring a pair of connectors to said input of said filtering-or-resonating unit" usually results in a Hall voltage being fed to filtering-or-resonating unit, for processing and finally determining the wanted angular orientation from a phase of the processed (filtered) signal.

In one embodiment which may be combined with one or more of the before-addressed embodiments, in the resulting filtered signal, higher harmonics are decreased relative to the fundamental frequency f by at least 10 dB, in particular by at least 20 dB.

In one embodiment which may be combined with one or more of the before-addressed embodiments, in the resulting filtered signal, higher harmonics are decreased such that a resulting intensity of any higher harmonic amounts to at most −20 dB relative to the intensity of the fundamental frequency f.

In one embodiment which may be combined with one or more of the before-addressed embodiments, the attenuation by the filtering-or-resonating unit is at least 20 dB at 2f, and in particular also at least 20 dB at f/2. An attenuation of 20 dB at 2f will typically result in a distortion of about 0.3° in the output signal corresponding to a sensing error of 0.3°.

In one embodiment which may be combined with one or more of the before-addressed embodiments, said control unit is or comprises a logic circuit.

In one embodiment which may be combined with one or more of the before-addressed embodiments, in the output unit, a phase of said filtered signal is detected, such that the output unit can be considered a phase reading unit.

In one embodiment which may be combined with one or more of the before-addressed embodiments, the output signal depends on a phase of said filtered signal.

In one embodiment which may be combined with one or more of the before-addressed embodiments, the output signal is a PWM signal or a digital signal.

In one embodiment which may be combined with one or more of the before-addressed embodiments, one of or typically each of said N Hall effect devices comprises two or more operationally interconnected Hall effect devices, in particular wherein these are interconnected in series or in parallel. This can provide an improved accuracy. In case of a parallel interwiring of more than one Hall effect devices, the Hall effect device will usually comprise an adder, for summing up Hall voltage of the interwired single Hall effect devices.

In one embodiment which may be combined with one or more of the before-addressed embodiments, the N Hall effect devices are vertical Hall effect devices, in other words, their detection direction is aligned parallel to a semiconductor surface of a semiconductor device in which the are manufactured.

In one embodiment which may be combined with one or more of the before-addressed embodiments, said specific sequence is a sequence related to or depending on a relative alignment of said detection directions of said Hall effect devices.

In one embodiment which may be combined with one or more of the before-addressed embodiments, said durations ti, i=1, . . . , N, of said time periods are related to or depending on a relative alignment of said detection directions of said Hall effect devices. In particular, in this embodiment one can provide that said durations are related to or depending on a distribution of said detection directions when these are plotted into the positive-y half-plane of an x-y-coordinate system.

In one embodiment which may be combined with one or more of the before-addressed embodiments, all said durations ti, i=1, . . . , N, are equal.

In one embodiment which may be combined with one or more of the before-addressed embodiments except for the last one, in case a magnetic field to be sensed is known to be inhomogeneous (in the sense of having an angle-dependent magnetic field amplitude), the durations ti, i=1, . . . , N, are chosen so as to increase the sensing accuracy by compensating for this inhomogeneity by choosing said durations appropriately.

In one embodiment which may be combined with one or more of the before-addressed embodiments, said control unit is furthermore structured and configured for controlling said wiring unit in such a way that after the before-mentioned first and second time periods of a duration 0.5 Tf, the following is accomplished:

during a third time period of a duration 0.5 Tf, subsequent to said second time period of a duration 0.5 Tf, and in the same specific sequence of said N Hall effect devices, to each of said N Hall effect devices a respective wiring scheme Wi++, i=1, . . . , N, is applied during respective subsequent time periods of said same durations ti, i=1, . . . , N; and during a fourth time period of a duration 0.5 Tf, subsequent to said third time period of a duration 0.5 Tf, and in the same specific sequence of said N Hall effect devices, to each of said N Hall effect devices a respective wiring scheme Wi−−, i=1, . . . , N, is applied during respective subsequent time periods of the same durations ti, i=1, . . . , N;

wherein each of said wiring schemes Wi++ is an orthogonal and reverse wiring scheme of the respective wiring scheme Wi−−, i=1, . . . , N;

wherein each of said wiring schemes Wi++ is a non-orthogonal and non-reverse wiring scheme of the respective other wiring scheme Wi+ non-identical with said respective other wiring scheme Wi+, i=1, . . . , N; and wherein each of said wiring schemes Wi−− is a non-orthogonal and non-reverse wiring scheme of the respective other wiring scheme Wi− non-identical with said respective other wiring scheme Wi−, i=1, . . . , N.

Typically, the sequence carried out during the first to fourth time periods of duration 0.5 Tf is repeated.

In one embodiment which may be combined with one or more of the before-addressed embodiments, said specific sequence is a sequence which can be obtained by plotting said detection directions of said Hall effect devices into the positive-y half-plane of an x-y-coordinate system and ordering the Hall effect devices according to the respective angle enclosed between the detection direction of the respective Hall effect device and the positive x-axis, such that said angles constitute a monotonously increasing or monotonously decreasing series. When the Hall effect devices are ordered according either to increasing or to decreasing angles, the before-mentioned staircase signal will have a suitable form for extracting the before-mentioned sine wave.

In one embodiment which may be combined with one or more of the before-addressed embodiments, said filtering-or-resonating unit has a filter frequency f at which attenuation is minimum or amplification is maximum.

In one embodiment which may be combined with one or more of the before-addressed embodiments, said filtering-or-resonating unit is or comprises a bandpass filter having a quality factor Q (also sometimes simply referred to as "quality") of about $Q=\pi/2$. Therein, n designates Archimedes' Constant, approximately 3.14. In particular, said quality factor amounts to $Q=1.57\pm0.25$, or, for better results, to $Q=1.57\pm0.1$. This way, in measurements of rotating magnetic fields such as in rotation speed measurements, the naturally occurring phase shift at frequencies near the filter frequency f can be used for reducing, in particular for compensating for a time lag of the outputting of the output signal with respect to the time when the magnetic field in fact had the angular position indicated in the output signal. Said specific sequence will in this case be chosen in dependence of the direction of rotation of the magnetic field.

In one embodiment which may be combined with one or more of the before-addressed embodiments, said control unit is furthermore structured and configured for controlling said wiring unit in such a way that for at least one of said N Hall effect devices
  the respective pair of connectors of the respective Hall effect device, which is connected to said current source during the respective time period of duration $t_i$, $i=1, \ldots, N$, is wired to said current source already before the beginning of said respective time period, and that this wiring is maintained until and throughout said respective time period;
and/or
  said wiring of the respective pair of connectors of the respective Hall effect device connected to said current source during the respective time period of duration $t_i$, $i=1, \ldots, N$ is maintained throughout said respective time period and until after termination of said respective time period;
is accomplished
  In particular, it will be provided that this applies for each said N Hall effect devices, and more particularly both will be accomplished for each of said N Hall effect devices. This allows to solve problems arising from switching spikes when connecting a Hall effect device to the current source and/or when disconnecting a Hall effect device from the current source. Such connecting/disconnecting may result in current spikes which reflect in the Hall voltage, such that measurement accuracy is diminished. The described embodiment suggests to make (establish) or undo the connections of a respective Hall effect device to the at least one current source at a time when no Hall voltage is fed from that respective Hall effect device to the filtering unit, or, more precisely, when no Hall signal of that respective Hall effect device contributes to the output signal. This embodiment will result in a need for the at least one current source to produce twice the current required (at minimum) when operating the sensor without the described advanced connection/delayed disconnection, which can be accomplished by a stronger current source or by a providing two current sources.

In one embodiment which may be combined with one or more of the before-addressed embodiments, the sensor comprises
  an additional, second set of $N\geq2$ Hall effect devices, each Hall effect device of said second set being constructed substantially identical to a respective Hall effect device of said first set, each Hall effect device of said second set being aligned the same way as said respective Hall effect device of said first set, but rotated about an axis perpendicular to said plane by substantially 180° with respect to said respective Hall effect device of said first set;
  wherein said control unit is furthermore structured and configured for controlling said wiring unit in such a way that
    the before-described application of wiring schemes to said pairs of connectors of said Hall effect devices of said first set is simultaneously applied to the respective Hall effect devices of said first set, for the same durations $t_i$, $i=1, \ldots, N$, and in the same specific sequence as for the respective Hall effect devices of said first set;
  wherein said filtering-or-resonating unit comprises a subtraction unit having two inputs, for obtaining a difference between signals fed to said inputs, wherein those pairs of connectors of the Hall effect devices of the first and second sets, respectively, which are connected to said filtering-or-resonating unit, are operationally connected to one of said inputs each. This allows for a very good offset compensation in case of strongly non-linear Hall effect devices. Accordingly, an even furtherly improved signal accuracy can be achieved. Said operational connection can be provided before or after the filtering: Either the Hall voltage signals from the Hall effect devices of the first set and the second set, respectively, are separately filtered in the described way in the filtering-or-resonating unit, and then the difference between the respective filtered signals is formed, or, more typically, firstly, the difference between the Hall voltage signals from the Hall effect devices of the first set and the second set, respectively, is obtained, and then the resulting difference signal is filtered in the described way in the filtering-or-resonating unit. Typically, the filtering-or-resonating unit comprises an adder and an inverter (the inverter at one input of the adder) for accomplishing said subtraction.

In one embodiment which may be combined with one or more of the before-addressed embodiments, said output unit is furthermore structured and configured for comparing filtered signals to a non-zero constant signal and deriving from a result of said comparing an additional output signal which is indicative of an amplitude of said projection of said magnetic field vector of said magnetic field into said plane. This way, it is possible to measure an amplitude of said projection of said magnetic field into said plane. This is possible, because the comparing of the approximately sine-shaped filtered signal to a non-zero constant signal results in a pulse signal the length of which depends on the amplitude of the approximately sine-shaped filtered signal and thus on the amplitude of said projection of said magnetic field.

It is to be noted the before-described way of obtaining an output signal indicative of an amplitude of said projection of said magnetic field not necessarily has to be combined with the before-described sensing of an angular orientation of said projection.

In one embodiment which may be combined with one or more of the before-addressed embodiments, said output unit comprises a comparator and a phase detection unit, more particularly a latch and a comparator and a counter, in particular wherein said output unit substantially consists of a comparator and a phase detection unit, more particularly of a latch and a comparator and a counter. This is a very simple and cost-effective way of implementing the output unit, in particular an output unit outputting a digital signal. And, in addition, such an output unit responds very fast to inputted signals (filtered signals). In particular, said latch is a set-reset latch (SR latch).

For a sensor with N=2 Hall effect devices, the sensor can be described as a sensor for sensing an angular orientation of a projection of a magnetic field vector of a magnetic field into a plane, wherein said sensor comprises at least a first and a second Hall effect devices each having a detection direction, said detection directions of said first and a second Hall effect devices being aligned with respect to each other in a non-parallel fashion, said Hall effect devices each comprising two pairs of connectors, wherein, in presence of said magnetic field, a flow of an electric current between the connectors of any of said pairs of connectors allows to pick up (or measure) a Hall voltage between the connectors of the other respective pair of connectors induced by said magnetic field unless a magnetic field component of said magnetic field along said detection direction is zero;

at least one filtering-or-resonating unit comprising an input and an output;

at least one current source comprising an output for outputting an electrical current at its output;

a wiring unit operationally connected to each of said connectors of each of said Hall effect devices structured and configured for selectively wiring said pairs of connectors to said output of said current source or to said input of said filtering-or-resonating unit, wherein a particular way of wiring both pairs of connectors of a Hall effect device is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;

a control unit structured and configured for controlling said wiring unit in such a way that for a duration of a duration Tf/4 a first wiring scheme is applied to said at least one first Hall effect device, and subsequently, for a duration of a duration Tf/4, a second wiring scheme is applied to said second Hall effect device, and subsequently, for a duration of a duration Tf/4, a third wiring scheme is applied to said first Hall effect device, and subsequently, for a duration of a duration Tf/4, a fourth wiring scheme is applied to said second Hall effect device;

wherein said first and third wiring schemes are orthogonal and reverse wiring schemes; and wherein said second and fourth wiring schemes are orthogonal and reverse wiring schemes;

an output unit operationally connected to said output of said filtering-or-resonating unit structured and configured for obtaining from a signal outputted from said filtering-or-resonating unit an output signal indicative of said angular orientation and for outputting said signal;

wherein said filtering-or-resonating unit is structured and configured for filtering an inputted signal of a fundamental frequency f=1/Tf containing, in addition to said fundamental frequency, higher harmonics, in such a way that an intensity of said higher harmonics is decreased relative to an intensity of said fundamental frequency.

Usually, the detection directions of said first and second Hall effect devices are aligned with respect to each other in a perpendicular fashion. And, usually, said first and second Hall effect devices are aligned such that their detection directions lie in said plane.

Generally, the invention comprises methods with corresponding features of corresponding sensors according to the invention, and sensors with corresponding features of corresponding methods according to the invention.

The advantages of the methods basically correspond to the advantages of corresponding apparatuses and vice versa.

The method for sensing an angular orientation of a projection of a magnetic field vector of a magnetic field into a plane comprises the steps of a) providing at least a first set of N≧2 Hall effect devices, each having a detection direction and comprising two pairs of connectors, wherein, in presence of said magnetic field, a flow of an electric current between the connectors of any of said pairs of connectors allows to pick up (or measure) a Hall voltage between the connectors of the other respective pair of connectors induced by said magnetic field, unless a magnetic field component of said magnetic field along said detection direction is zero, wherein said N Hall effect devices are aligned such that their detection directions lie in said plane, and wherein at least two of said Hall effect devices have non-identical detection directions;

b) providing at least one filtering-or-resonating unit comprising an input and structured and configured for altering an inputted signal of a fundamental frequency f=1/Tf, said inputted signal containing, in addition to said fundamental frequency, higher harmonics, in such a way that an intensity of said higher harmonics is decreased relative to an intensity of said fundamental frequency;

c) providing at least one current source comprising an output and capable of outputting an electrical current at its output; wherein a particular way of wiring both pairs of connectors of a Hall effect device to said output of said current source or to said input of said filtering-or-resonating unit is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;

d1) applying, during a first time period of a duration 0.5 Tf and in a specific sequence of said N Hall effect devices, to each of said N Hall effect devices a respective wiring scheme Wi+, i=1, . . . , N, during respective subsequent time periods of durations ti, i=1, . . . , N; and d2) applying, during a second time period of a duration 0.5 Tf, subsequent to said first time period of a duration 0.5 Tf, and in the same specific sequence of said N Hall effect devices, to each of said N Hall effect devices a respective wiring scheme Wi−, i=1, . . . , N, during respective subsequent time periods of the same durations ti, i=1, . . . , N;

wherein each of said wiring schemes Wi+ is an orthogonal and reverse wiring scheme of the respective other wiring scheme Wi−, i=1, . . . , N; and e) deriving from signals outputted by said filtering-or-resonating unit in reaction to carrying out steps d1) and d2) an output signal indicative of said angular orientation.

The signals outputted by said filtering-or-resonating unit can be referred to as "filtered signals". Typically, the sequence of steps d1, d2 is repeatedly carried out, in particular subsequently.

In one embodiment, the method comprises carrying out after step d2) the steps of d3) applying, during a third time period of a duration 0.5 Tf, subsequent to said second time period of a duration 0.5 Tf, and in the same specific sequence of said N Hall effect devices, to each of said N Hall effect devices a respective wiring scheme Wi++, i=1, . . . , N, during respective subsequent time periods of said same durations ti, i=1, . . . , N; and d4) applying, during a fourth time period of a duration 0.5 Tf, subsequent to said third time period of a duration 0.5 Tf, and in the same specific sequence of said N Hall effect devices, to each of said N Hall effect devices a respective wiring scheme Wi--, i=1, . . . , N, during respective subsequent time periods of said same the same durations ti, i=1, . . . , N;

wherein each of said wiring schemes Wi++ is an orthogonal and reverse wiring scheme of the respective wiring scheme Wi--, i=1, . . . , N; and wherein each of said wiring schemes Wi++ is a non-orthogonal and non-reverse wiring scheme of the respective other wiring scheme Wi+ non-identical with said respective other wiring scheme Wi+, i=1, . . . , N; and wherein each of said wiring schemes Wi-- is a non-orthogonal and non-reverse wiring scheme of the respective other wiring scheme Wi- non-identical with said respective other wiring scheme Wi-, i=1, . . . , N.

In this embodiment, typically, the sequence of steps d1, d2, d3, d4 is repeatedly carried out, in particular subsequently. Usually, said output signals will be averaged over two periods, i.e. over a duration of 2 Tf.

In one embodiment which may be combined with the before-addressed embodiments, said magnetic field is a rotating magnetic field, and said filtering-or-resonating unit is or comprises a bandpass filter having a quality factor Q of substantially Q=π/2, the method comprising, in case said projection of said magnetic field vector, when plotted into said positive-y half-plane of said x-y-coordinate system, moves towards increasing angles, the step of e1) selecting said specific order such that said angles constitute a monotonously increasing series;

or, in case said projection of said magnetic field vector, when plotted into said positive-y half-plane of said x-y-coordinate system, moves towards decreasing angles, the step of e2) selecting said specific order such that said angles constitute a monotonously decreasing series.

This way, it can be achieved that the outputting of the output signal occurs (practically) at the same time as the sensed projection of the magnetic field in fact has the angular orientation indicated in the outputted signal. In other words, a time lag of the output signal with respect to the actual (current) magnetic field position can be reduced or even fully compensated for.

The invention furthermore comprises an integrated circuit comprising at least one sensor according to one of the invention, in particular wherein said integrated circuit is manufactured using CMOS processes.

The invention furthermore comprises a position sensor, in particular a sensor for sensing a rotational position of a rotatable item to which a magnet is attached.

The invention furthermore comprises a rotational-speed sensor comprising at least one sensor according to the invention or an integrated circuit according to the invention. In particular, the rotational-speed sensor furthermore comprises an evaluation unit operationally connected to said output unit structured and configured for obtaining an output indicative of a speed of rotation of said projection of said magnetic field vector of said magnetic field into said plane.

The invention furthermore comprises a revolution counter comprising at least one sensor according to the invention or an integrated circuit according to the invention. In particular, the revolution counter furthermore comprises an evaluation unit operationally connected to said output unit structured and configured for obtaining an output indicative of a number of rotations of said projection of said magnetic field vector of said magnetic field into said plane that have taken place from an initial point in time.

Further embodiments and advantages emerge from the dependent claims and the figures.

BRIEF DESCRIPTION OF THE DRAWINGS

Below, the invention is described in more detail by means of examples and the included drawings. The figures show.

The reference symbols used in the figures and their meaning are summarized in the list of reference symbols. The described embodiments are meant as examples and shall not confine the invention.

DETAILED DESCRIPTION OF THE INVENTION

Figure 1:
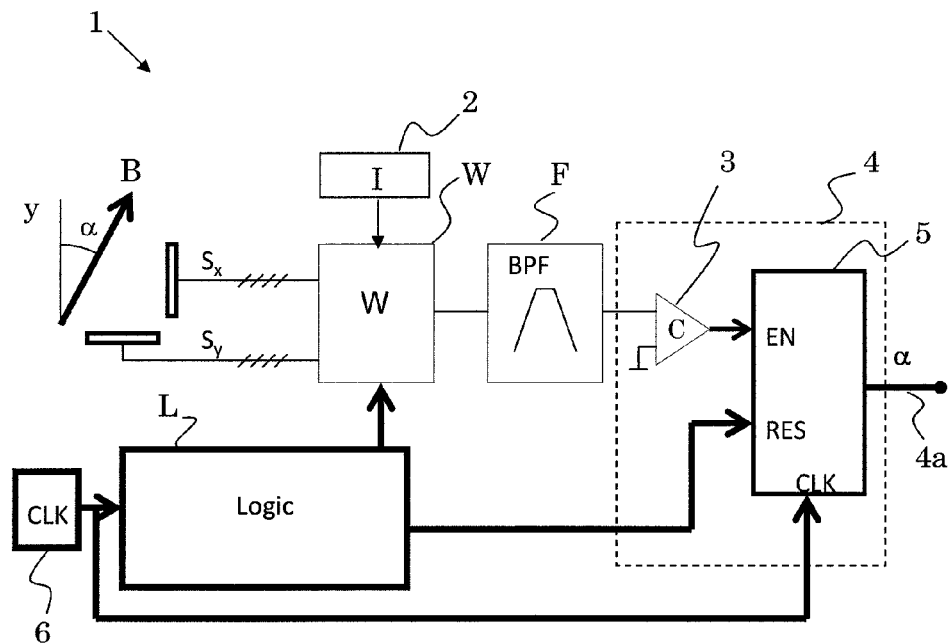
FIG. 1 a schematic block-diagrammatical illustration of a sensor.

FIG. 1 shows schematic block-diagrammatical illustration of a sensor 1 for sensing an angular orientation of a projection B of a magnetic field into a plane, wherein said plane is the drawing plane, and wherein said angular orientation is described by an angle α. Sensor 1 comprises two Hall effect devices Sx, Sy. The devices Sx, Sy are vertical Hall effect devices, with their respective detection directions lying in said plane, running along the x-axis (Sx) and along the y-axis (Sy), respectively. The devices Sx, Sy have two pairs of connectors each, and for sensing an angular orientation, a bias current is applied to a device via the one pair of connectors, and the resulting Hall voltage is detected via the other pair of connectors.

The devices Sx, Sy are operationally connected to a wiring unit W which is controlled by a control unit L. Wiring unit W applies wiring schemes to the devices Sx, Sy which determine which of the pairs of connectors is used for applying the bias current, and which for picking up the Hall voltage. Accordingly, the sensor 1 comprises a current source 2 operationally connected to wiring unit W.

Wiring unit W is furthermore operationally connected to a filtering unit F which is, in the embodiment of FIG. 1 embodied as a band pass filter, so as to filter the Hall voltage signals obtained via wiring unit W from the Hall effect devices Sx, Sy.

The filtered signals outputted by filtering unit F are fed into one input of a comparator 3, the other input of comparator 3 being connected to ground potential. The signal outputted by the comparator 3 is a digital signal (digital signals are drawn as bold arrows, analogue signals are drawn as thin lines), and the phase thereof can be detected in a way known in the art. For detecting the phase, e.g., a phase detection unit 5 like depicted in FIG. 1 can be used. Phase detection unit 5 is fed with the signal outputted by the comparator 3 (which is a PWM—Pulse Width Moduldation—signal), a signal outputted by control unit L (usually a square signal) and a clock signal outputted by clock 6. Comparator 3 and phase detection unit 5 are constituents of an output unit 4 of the sensor 1. A signal indicative of the sought angular orientation is outputted at output 4a of output unit 4 ("output signal").

Figure 10:
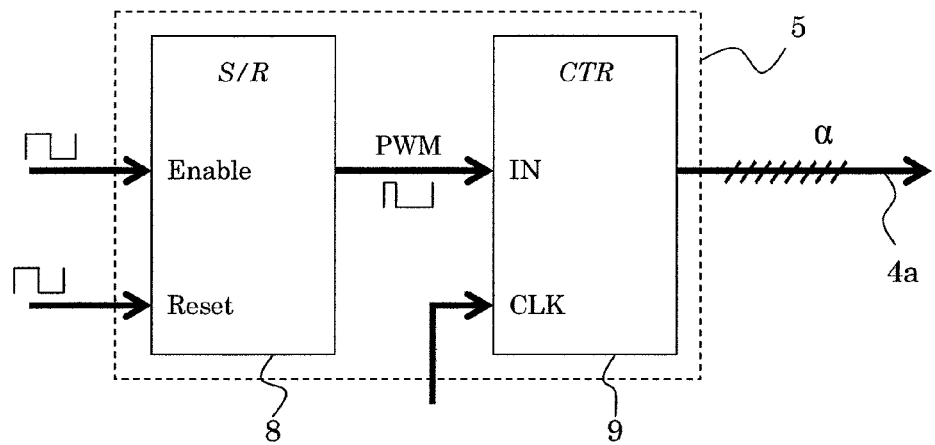
FIG. 10 a block-diagrammatical illustration of a phase detection unit.

An exemplary phase detection unit 5 as it could be used in the embodiment of FIG. 1 is block-diagrammatically illustrated in more detail in FIG. 10. Phase detection unit 5 comprises a set-reset latch 8 and a counter 9. Logic signals from comparator 3 and control unit L, respectively, are inputted to the two inputs of latch 8, e.g., the signal from comparator 3 is inputted to a set (or enable) input of latch 8, so as to trigger the on-state (or high state), and the signal from control unit L is inputted to a reset input of latch 8, so as to trigger the off-state (or idle state), or vice versa. Both inputted logic signals have the same frequency, but their relative phase depends on (and may even represent) the sought angle α. As a result, a PWM signal having a duty cycle representative of the relative phase of the two inputted logic signals and thus representative of the sought angle α is outputted. The PWM signal outputted by latch 8 is fed into counter 9 which in addition is provided with the clock signal (cf. FIG. 1) having a much higher frequency, e.g. three or four orders of magnitude higher than the beforementioned PWM signal, depending on the desired resolution. Counter 9 outputs output signals 4a, e.g., like sketched in FIG. 10, an eight-bit signal representative of the sought angle α. As mentioned before, other phase detection principles and implementations and in general, other output units 4 may be used.

Figure 2:
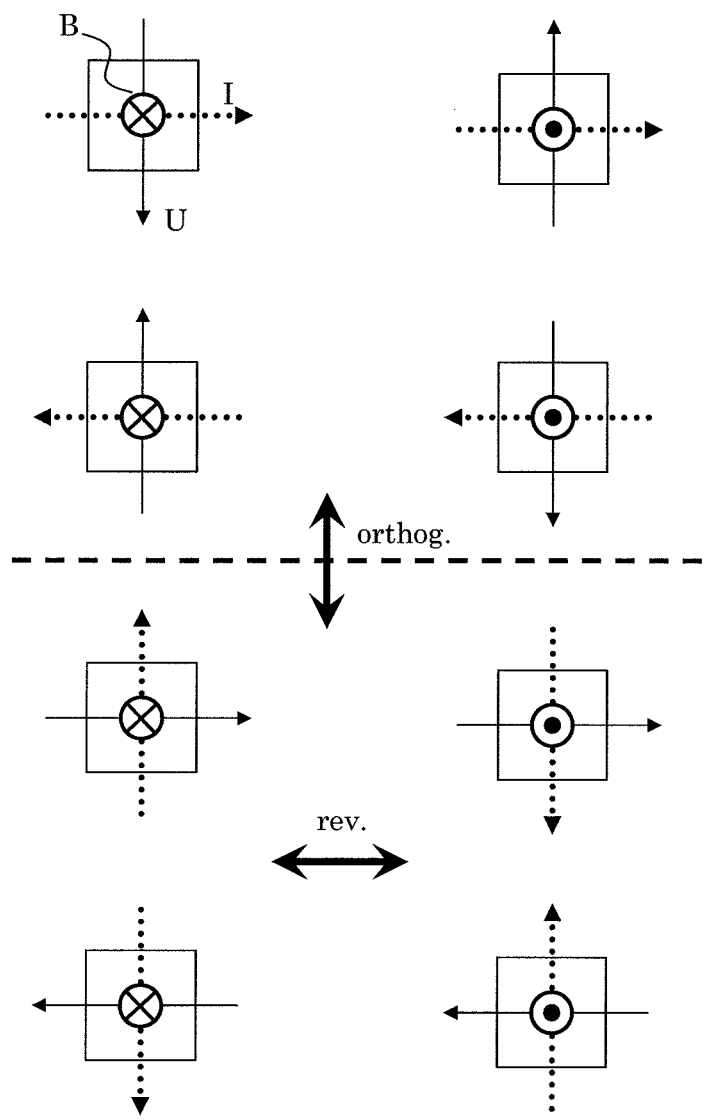
FIG. 2 a schematic symbolic illustration of all possible wiring schemes of a Hall effect device.

FIG. 2 is a schematic symbolic illustration of all possible schemes of a Hall effect device. The eight wiring schemes applicable to a Hall effect device are illustrated. In FIG. 2, a Hall effect device is symbolized by a square, the direction of flow of a bias current I is symbolized by a thin arrow, and the direction of detection of a Hall voltage VHall is symbolized by a dotted arrow. These "directions" correspond of course merely to a way of wiring the Hall effect device, i.e. of making connections to the connectors of the Hall effect device. The detection direction of the Hall effect device is perpendicular to the drawing plane, and the symbol in the middle of a Hall effect device indicates whether two wiring schemes result in a Hall voltage of the same or of opposite sign.

Those wiring schemes on the left hand side in FIG. 2 all result in the same sign of VHall, and accordingly, these wiring schemes are not reverse wiring schemes. The same applies to the wiring schemes on the right hand side of FIG. 2. But any wiring scheme on the left is a reverse wiring scheme of any wiring scheme on the right in FIG. 2.

Furthermore, any wiring scheme in the top half of FIG. 2 is orthogonal to any wiring scheme in the bottom half of FIG. 2, since the pair of connectors at which the bias current I is applied to a Hall effect device in the top half of FIG. 2 is used for outputting VHall at a Hall effect device in the bottom half of FIG. 2 and vice versa.

Figure 3:
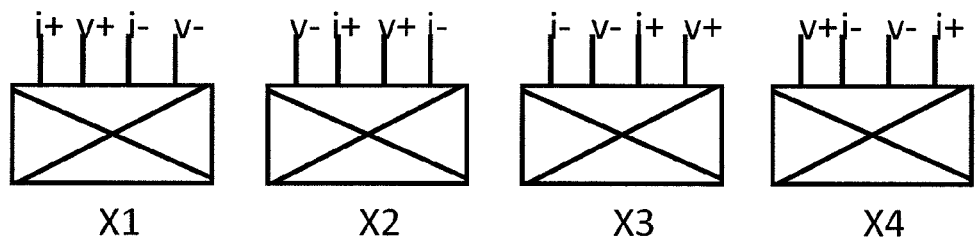
FIG. 3 a schematic symbolic illustration of four non-reverse wiring schemes of Hall effect device.

FIG. 3 illustrates four non-reverse wiring schemes X1, X2, X3, X4 of a Hall effect device (symbolized as a crossed box) in a way slightly different from FIG. 2. The letters i and v indicate connectors connected for bias current application and Hall voltage detection, respectively, and the "+" and "−" indicate the polarization (or "direction", cf. above). The corresponding reverse wiring schemes can be obtained by crossing the output connectors of the Hall effect device, i.e. by replacing v+ by v− and v− by v+ in FIG. 3; these (reverse) wiring schemes will be indicated by adding a minus, i.e. by −X1, −X2, −X3, −X4.

Figure 4:
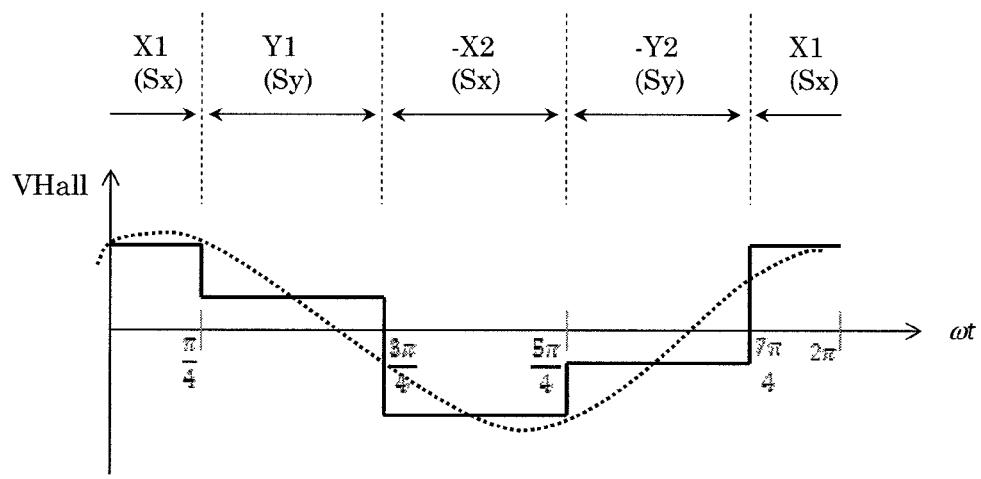
FIG. 4 an illustration of applied bias currents and resulting Hall voltages.

FIG. 4 shall assist the understanding of the way of functioning of the sensor 1 of FIG. 1 and shows an illustration of Hall voltages VHall resulting when applying bias currents to the Hall effect devices Sx and Sy of FIG. 1, and in particular the time development thereof. Therein, it is referred to the wiring schemes illustrated in FIG. 3, wherein a wiring scheme applied to device Sx will be referred to with the letter X (X1, X2, X3, X4), as indicated in FIG. 3, whereas the same wiring scheme applied to device Sy is referred to with the letter Y (Y1, Y2, Y3, Y4). The bias current applied to a Hall effect device is kept constant while feeding the corresponding Hall voltage signal to filtering unit F, and, accordingly, the bias current is applied to the Hall effect devices in form of (rectangular) current pulses, i.e. of pulses of constant current.

Wiring unit W firstly applies wiring scheme X1, then Y1, then −X2 and then −Y2. Thereafter, the same sequence of wiring schemes will be repeated again and again. In other words, a constant current I drawn from current source 2 will be alternately applied to devices Sx and Sy, and simultaneously, the respective device to which the bias current I is applied is connected with its other pair of connectors to filtering unit F. The Hall voltages entering filtering unit F describe a step function (drawn in solid lines in FIG. 4). The filtered signals outputted by filtering unit F are drawn as a dotted line in FIG. 4.

Filtering unit F has a fundamental frequency f corresponding to a period $T=1/f$, wherein T corresponds to $2\pi$ in FIG. 4. Each of the wiring schemes is applied for Tf/4 before changing the wiring to the next wiring scheme. Clock 6, together with control unit L, is operated accordingly.

The applied wiring schemes are chosen in such a way that (for the particular magnetic field direction shown in the example of FIG. 1) in a first half-period of Tf/2, the devices Sx, Sy generate a Hall voltage of the same sign, and in a subsequently following second half-period of Tf/4, orthogonal reverse wiring schemes will be applied, wherein the sequence of Hall devices to which the wiring schemes are applied is the same in the first and the second half-period.

This results in a filtered signal having the fundamental frequency $f=1/Tf$ and being substantially sine-shaped, wherein the phase of the filtered signal is indicative of the angle α describing the angular orientation of the projection B of the magnetic field to be detected. It is furthermore remarkable that an offset usually present in a Hall effect device will be cancelled this way.

Comparing the filtered signal with ground potential in comparator 3 results in a digital signal (more particularly in a square signal), and by means of this digital signal and the clock signal outputted by clock 6 and the logic signal (typically a square signal) outputted by control unit L, phase detection unit 5 (cf. also FIG. 10) can output a digital signal not only indicative of the angle α of the projection B of the magnetic field to be detected but directly indicating that sought angle.

Usually, all three of the following signals (cf. FIGS. 1 and 10), the one from the comparator 3, the one from control unit L, and the one fed from latch 8 to counter 9, have the same frequency, namely the before-mentioned frequency f.

Of course, other ways of evaluating the filtered signal are thinkable, in particular dispensing with comparator 3 and/or with latch 8 and/or counter 9. But such ways will usually be more complicated and/or slower.

When, as indicated in FIG. 4, the connections to the current source 2 are established simultaneously with the connections to the filtering unit F, current spikes and corresponding Hall voltage spikes can occur (not shown in FIG. 4), in particular when initiating the connections, but also when breaking the connections.

Such spikes in the voltage signals fed to filtering unit F result in inaccuracies of the detected angle α. In order to avoid such problems, it is possible to establish the connections of the devices Sx, Sy to the current source 2 already before the connections to the filtering unit F are made and/or to disconnect the current source 2 from the respective Hall effect device after the connections of that Hall effect device to the filtering unit F are broken. Accordingly, there are times when two times the bias current I is drawn. This of course requires that current source 2 can simultaneously provide two times the bias current I, or that a second current source is provided.

Figure 5:
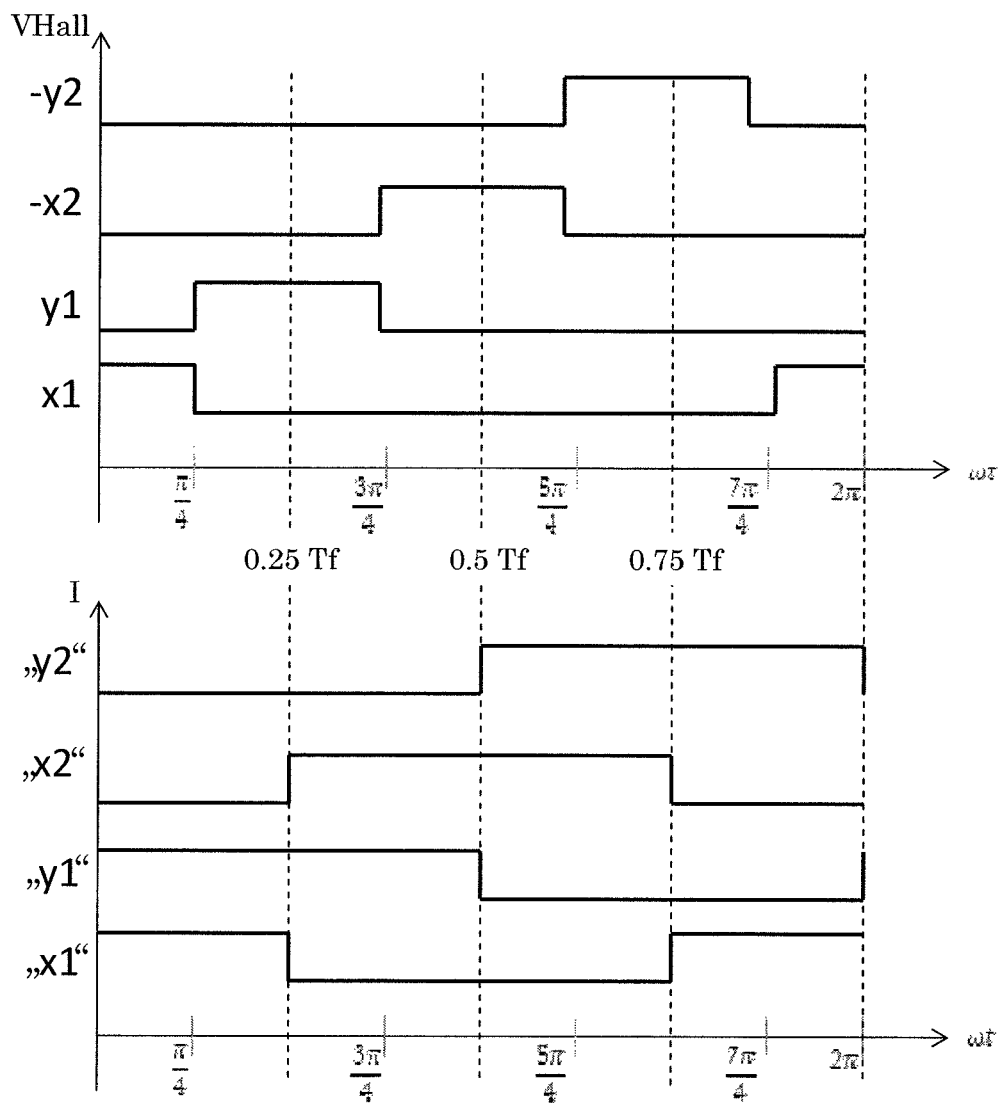
FIG. 5 an illustration of applied bias currents and resulting Hall voltages.

FIG. 5 shows an illustration of applied bias currents I and resulting Hall voltages VHall suitable for accomplishing the above-described procedure for suppressing spikes and thus improving measuring accuracy, in particular the time development of I and VHall is shown. In the lower part of FIG. 5 where the applied currents I are shown, the indicated wiring schemes for Sx and Sy are put in quotes because the full wiring scheme (comprising the connections of both pairs of connectors) is of course only present during that portion of time during which also the other pair of connectors is properly connected, namely to the filtering unit F.

Reading example for FIG. 5: Whereas for Sy the connections to filtering unit F according to wiring scheme Y1 are present from π/4 to 3π/4 (upper portion of FIG. 5) only, the connections to current source 2 according to wiring scheme Y1 are present from 0 to π/2 (lower portion of FIG. 5). In this case, the connections for applying the bias current I are established and broken a duration of Tf/8 (corresponding to π/4) earlier and later, respectively than the connections to filtering unit F; they are present twice as long as the connections to filtering unit F are present and centered about the time the connections to filtering unit F are present.

Another possible improvement which allows to achieve an excellent offset cancellation even in case of strongly non-linear Hall effect devices makes use of not only two wiring schemes (in each Hall effect device), but of four.

The repeating wiring sequence in this case has a length of not only Tf, but of 2 Tf. During the first period of length Tf, the same sequence as illustrated in FIG. 4 can be used, i.e. X1, Y1, −X2, −Y2. But in the second period of length Tf, the sequence X3, Y3, −X4, −Y4 is applied (cf. FIG. 3). The filtered signal is then an average between the first and the second period of length Tf.

Of course, this embodiment can be also combined with the embodiment illustrated in FIG. 5.

Figure 6:
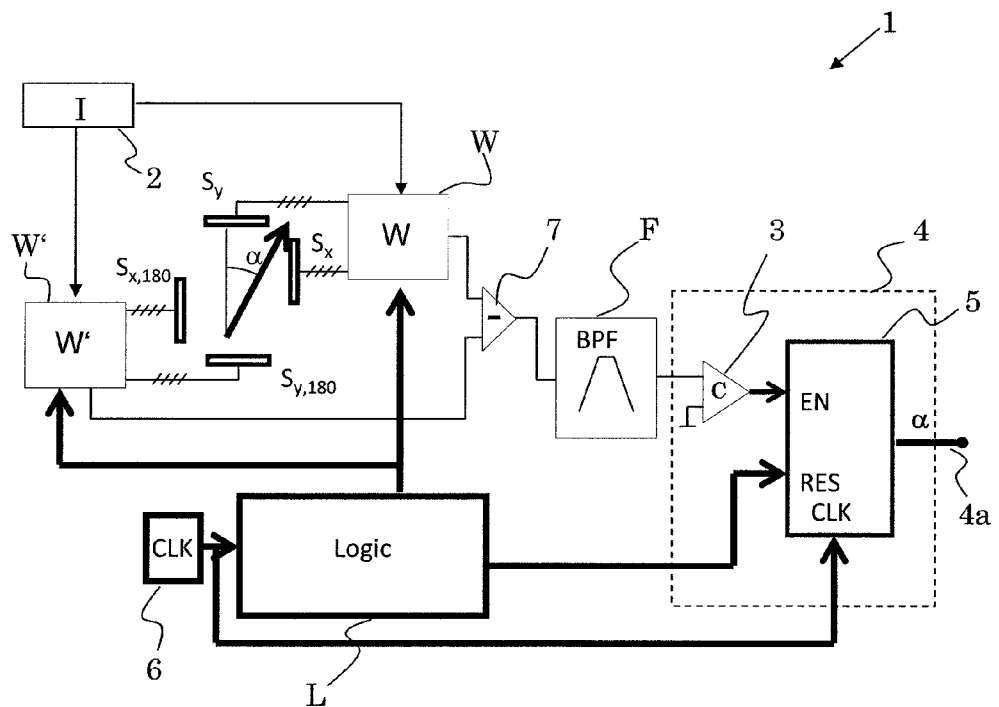
FIG. 6 a schematic block-diagrammatical illustration of an improved sensor.

Yet another possible improvement is shown in FIG. 6. FIG. 6 shows a schematic block-diagrammatical illustration of an improved sensor 1. In this case, an additional, second set of Hall effect device is provided: it comprises devices Sx180 and Sy180. These devices are preferably constructed identical to the respective devices Sx, Sy, and they are aligned the same way as these, but rotated about an axis perpendicular to the drawing plane by 180° with respect to the corresponding other device. The additional devices Sx180, Sy180 are also controlled by wiring unit W, or, as shown in FIG. 6, by an additional wiring unit W' which is similar to wiring unit W; both wiring units W, W' are controlled by control unit L. Otherwise, the properties of the embodiment of FIG. 6 can be inferred from the properties of the embodiment of FIGS. 1 (and 10).

To Sx180 and Sx, the same wiring schemes are simultaneously applied, and to Sy180 and Sy, the same wiring schemes are simultaneously applied. The wiring schemes may be those discussed in conjunction with FIG. 4 (X1, Y1, −X2, −Y2) or those of the improved embodiment mentioned above (X1, Y1, −X2, −Y2, X3, Y3, −X4, −Y4), wherein the spike-suppression idea (cf. FIG. 5) may of course be applied here, too.

Before the VHall signals of the Hall effect devices are fed to filtering unit F, a difference between the VHall signals from the first set of devices (Sx, Sy) and the VHall signals from the second set of devices (Sx180, Sy180) is formed using a subtraction unit 7, e.g., embodied as an adder and an inverter, and that difference signal is then fed to filtering unit F. Due to the rotated alignment of the second two devices Sx180, Sy180, the absolute value of that difference signal will be approximately twice the absolute value derived from each of the sets of the devices, and thus, not only the signal-to-noise ratio will be improved, but much more importantly, switching noise occurring when establishing or breaking the connection to filtering unit 6 (by changing wiring schemes) will—at least to a great extent—cancel. Accordingly, an even more accurate output signal can be obtained, but at the cost of having to provide two times the bias current as compared to using only half the number of Hall effect devices.

In another special embodiment which is particularly suitable when the projection B is rotating, the filtering unit substantially is a band pass filter, in particular one having a quality factor Q of preferably about π/2.

In a situation where the magnetic field (and also the projection B) is rotating, like in the typical case of a permanent magnet attached to a rotating shaft, the available data (outputted by output unit 4) is always delayed with respect to the (current) shaft position, because the sensor's output is related to the average position of the shaft during the measurement cycle, and not to the position at the end of the measurement cycle.

This lag behind becomes important when the measurement time is not short with respect to the magnet revolution period, or when the data is subsequently averaged (for instance for decreasing noise). One solution would be to correct the outputted data by evaluating the rotation speed, e.g., by taking the former position and add or subtract the shaft displacement during half an output period. This, however, requires some logic processing which costs measurement time and requires a relatively complex implementation.

The proposed solution, however, is to make use of the natural phase shift generated by a band pass filter when the frequency moves away from the center frequency. And exactly this takes place when the field is rotating. The frequency of the signal at the band pass filter input decreases when the magnetic field projection B rotates in the same direction as described by the wiring sequence (in the example of FIG. 1: x, y, −x, −y, the letters indicating the Hall effect devices Sx, Sy, the sign indicates reversed wiring schemes), and it increases when the magnet rotates in the opposite direction as described by the wiring sequence. As a consequence, the filter introduces a positive phase shift when the magnet rotates against the wiring sequence and a negative phase shift when the magnet rotates in the same sense as the wiring sequences.

Thus, one can design the band pass filter in an adequate way, detect the rotating direction of the magnetic field projection and set the measurement direction (more precisely, the sequence of wiring schemes) accordingly such that the phase shift at least substantially cancels the lag described above (x, y, −x, −y; or: −y, −x, y, x).

The quality factor Q of substantially π/2 allows to practically perfectly compensate for the described lag.

Another aspect which is not necessarily linked to the above-described embodiments and the particular way of wiring, relates to a possibility to determine the amplitude of the projection B of the magnetic field. For explaining this in more detail, we will nevertheless refer to the embodiments above, for reasons of simplicity in particular to the embodiment of FIG. 1.

Figure 7:
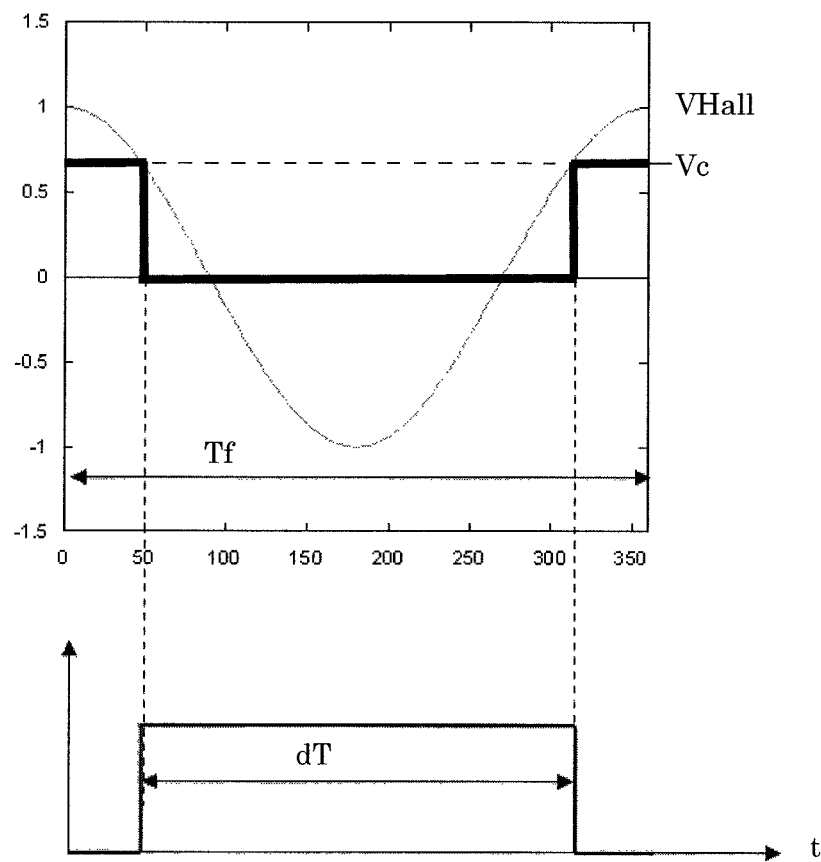
FIG. 7 an illustration of signals usable for obtaining information about an amplitude of a magnetic field.

FIG. 7 is an illustration of signals usable for obtaining information about a amplitude of a magnetic field, more precisely an illustration of signals usable for determining the amplitude of a projection B of a magnetic field into a plane. Referring to FIG. 1, it is possible to use the comparator 3 not only with one input grounded, but it is possible to apply a voltage Vc to one input. The other input receives a Hall voltage signal VHall, as is the case in FIG. 1, in particular an at least approximately sine-shaped signal (cf. also the dotted line in FIG. 4).

In the upper portion of FIG. 7, the Hall voltage signal VHall is shown (having a period Tf), as is the voltage Vc. In the lower portion of FIG. 7, the signal outputted from the comparator 3 is indicated. With Vc (Vc≠0 Volt) suitably adjusted to a voltage having an absolute value smaller than the smallest VHall signal amplitude to be expected, the duty cycle dT of the signal outputted from the comparator will depend on the before-addressed amplitude of a projection B of the magnetic field, the larger dT, the larger the amplitude of said projection B.

Suitably gauging dT vs. the amplitude of said magnetic field amplitude allows to establish a magnetic field amplitude measuring device or a sensor for sensing a magnetic field amplitude of a projection of a magnetic field vector of a magnetic field into a plane and a corresponding method.

As will be clear from the remarks above, this use of a comparator for determining a magnetic field amplitude of a projection of a magnetic field vector of a magnetic field into a plane can work with any Hall voltage signal (which is continuous or quasi-continuous), not only with a sine-shaped one and in particular not only with Hall voltage signals derived using wiring scheme changes like described herein before.

Of course, all the concepts described above do not only work with 2 or with 4 Hall effect devices. And these do not necessarily have to be arranged with their detection directions parallel to two perpendicular directions, even though this will usually be the case. It is also possible to use three or more (and six or more) Hall effect devices and apply the same ideas as addressed above. But in this case, it is advisable to carefully select the order (sequence) in which Hall voltages are fed from the respective Hall effect device to the filtering unit. And, in addition, e.g., if the angular orientation of the Hall effect devices is not regularly spaced, it is advisable to carefully adjust the time durations during which each respective Hall effect device feeds its Hall voltage to filtering unit F.

Both, order (sequence) and times shall be chosen such that the staircase signal fed to the filtering unit mimics (as close as possible) a sine signal of frequency f=1/Tf.

Furthermore, it shall be mentioned that each of the Hall effect devices mentioned herein can be a simple Hall effect device or can be composed of two or more simple Hall effect devices, the latter being wired in a parallel or serial or mixed parallel-and-serial way.

Figure 8:
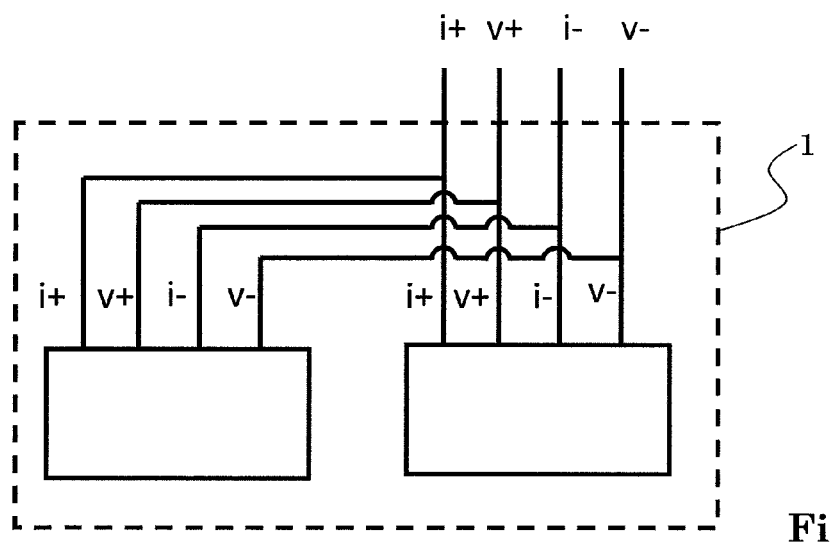
FIG. 8 a block-diagrammatical illustration of a composed Hall effect device.

For a Hall effect device composed of two simple Hall effect devices wired in parallel (with respect to their current supply), this is block-diagrammatically illustrated in FIG. 8. The composed Hall effect device 1 has its two pairs of connectors to which each of the two simple Hall effect devices are connected in parallel.

Figure 9:
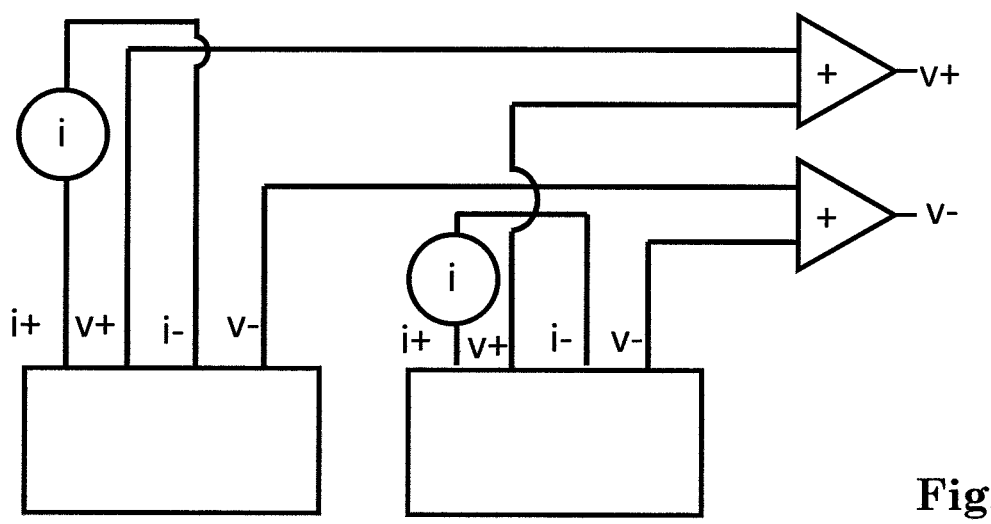
FIG. 9 a block-diagrammatical illustration of a composed Hall effect device.

FIG. 9 shows a block-diagrammatical illustration of another composed Hall effect device composed of two simple Hall effect devices. For each of the two simple Hall effect devices, a separate current supply is provided, wherein it is also possible to look upon these two separate current supplies as two components of one (composed) current supply. The voltages v− and v+, respectively, of the two simple Hall effect devices are fed to separate adders in order to provide the Hall voltage of the composed Hall effect device.

In general, a Hall effect device according to the invention may of course have more than those four contacts which correspond to the before-addressed two pairs of contacts.

An example is given in FIG. 9 where six contacts are present: v+ and v− (outputted from the adders) and for each simple Hall effect device, one i+ and one i− contact is provided, wherein it is also possible to short two current contacts, one of each simple Hall effect device, e.g., the two i− contacts, such that the composed Hall effect device can be considered to have five contacts.

Analogously to what is shown in FIG. 9, it is also possible to join (i.e. to short) two of the current contacts, e.g., the i− contact of the left and the i+ contact of the right simple Hall effect device, and use one (simple) current supply for supplying both simple Hall effect devices with bias current, thus realizing a composed Hall effect device comprising two simple Hall effect devices connected serially (with respect to their current supply). Otherwise, the composed Hall effect remains as depicted in FIG. 9, including the two adders All the embodiments mentioned above can very well be realized in a single silicon chip, in particular using CMOS processes. So-called vertical integrated Hall effect devices are particularly well suited for such a realization.

Figure 11:
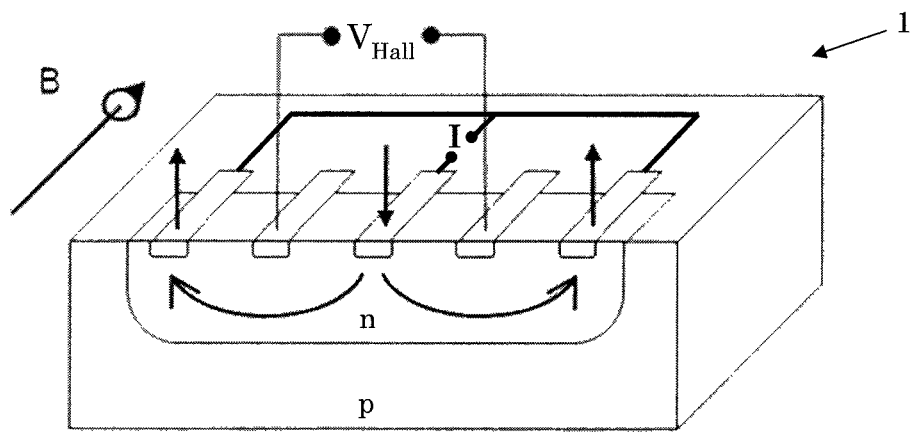
FIG. 11 a schematized perspective view of a cross-section through a vertical integrated Hall effect device.

FIG. 11 exemplarily shows a schematized perspective view of a cross-section through a vertical integrated Hall effect device 1. In a p-doped Silicon substrate, an n-doped well is provided, five metal contacts embodied as parallel-aligned contact lines being provided on the surface of the Silicon substrate, for applying a bias current I and picking up a Hall voltage VHall. Usually, two of the five metal contacts will be shorted, namely the outermost two, as schematically indicated by the bold lines in FIG. 11. The arrow labelled B to the left of the vertical integrated Hall effect device 1 illustrates a magnetic field vector of a magnetic field aligned parallel to the detection direction of the vertical integrated Hall effect device 1.

According to one exemplary wiring scheme indicated in FIG. 11, the contact in the middle is used for injecting the bias current which then flows, as visualized by the bent arrows, to both outermost contacts, a current source (only symbolically sketched in FIG. 11) being connected between the middlemost and the two outermost contacts. Of course it is also possible to use two separate (simple) current sources, each contacting one of the outermost metal contacts and both contacting the middlemost metal contact. As illustrated in FIG. 11, the other two contacts are used for picking up the resulting Hall voltage (which is present if a non-zero magnetic field component exists parallel to the detection direction).

Figure 12:
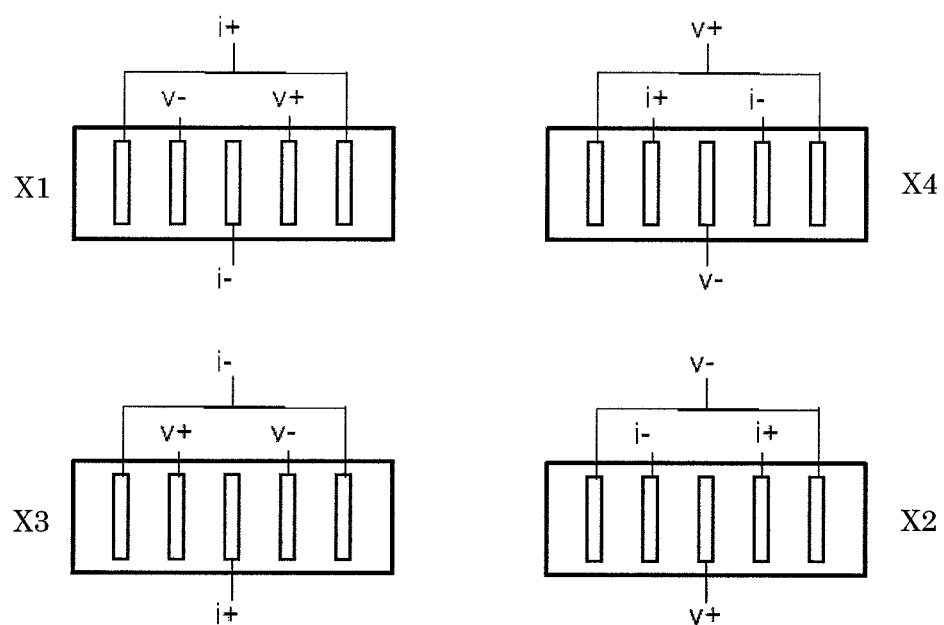
FIG. 12 schematic symbolic illustration of four non-reverse wiring schemes applied to a vertical integrated Hall effect device.

FIG. 12 is a schematic symbolic illustration of four non-reverse wiring schemes applied to a vertical integrated Hall effect device. With reference to the vertical integrated Hall effect device 1 of FIG. 11, FIG. 12 can be understood as symbolizing top views onto such vertical integrated Hall effect devices 1. The four wiring schemes illustrated in FIG. 12 are named exactly as in FIG. 3, confer there for details.

All the embodiments described above can be used in position sensing (e.g., determining the rotational position of a rotor a motor), in rotation counting, in rotational speed sensing and for similar purposes involving a magnetic field.

Aspects of the embodiments have been described in terms of functional units. As is readily understood, these functional units may be realized in virtually any number of components adapted to performing the specified functions. For example, one control unit L and only one wiring unit can be used for realizing an embodiment functioning like the one of FIG. 6, but one could also realize it using two control units and two wiring units W, W'.

Furthermore, the filtering unit F could also be realized as a lowpass filter, and possibly in addition an offset remover (for suppressing DC voltage offsets), at least in the embodiments different from the one described above for compensating for a lag in time using a band pass filter having a suitable quality factor. Generally, the main purpose of the filtering unit is to extract the sine wave of frequency $f=1/Tf$ (having the sought phase) from the Hall voltage staircase signal.

LIST OF REFERENCE SYMBOLS 1 sensor
2 current source
3 comparator
4 output unit
4a output, output of output unit
5 phase detection unit
6 clock
7 subtraction unit
8 latch, set-reset latch
9 counter
B projection of a magnetic field into a plane
F filtering-or-resonating unit, filtering unit, filter
I current, bias current
L control unit
Sx, Sy, Sx180, Sy180 Hall effect devices
Td duty cycle
VC voltage, voltage at comparator
VHall Hall voltage
W wiring unit
α angle

The invention claimed is:

1. Sensor for sensing an angular orientation of a projection of a magnetic field vector of a magnetic field into a plane, said sensor comprising
    at least a first set of $N \geq 2$ Hall effect devices, each having a detection direction and comprising two pairs of connectors, wherein, in presence of said magnetic field, a flow of an electric current between the connectors of any of said pairs of connectors allows to pick up a Hall voltage between the connectors of the other respective pair of connectors induced by said magnetic field, unless a magnetic field component of said magnetic field along said detection direction is zero, wherein said N Hall effect devices are aligned such that their detection directions lie in said plane, and wherein at least two of said Hall effect devices have non-identical detection directions;
    at least one filtering-or-resonating unit comprising an input and an output, wherein a signal outputted from said output is referred to as filtered signal;
    at least one current source comprising an output for outputting an electrical current at its output;
    a wiring unit operationally connected to each of said connectors of each of said N Hall effect devices structured and configured for selectively wiring said pairs of connectors to said output of said current source or to said input of said filtering-or-resonating unit, wherein a particular way of wiring both pairs of connectors of a Hall effect device is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;
    a control unit structured and configured for controlling said wiring unit in such a way that
    during a first time period of a duration 0.5 Tf and in a specific sequence of said N Hall effect devices, to each of said N Hall effect devices a respective wiring scheme Wi+ is applied, $i=1, \ldots, N$, during respective subsequent time periods of durations ti, $i=1, \ldots, N$; and
    during a second time period of a duration 0.5 Tf, subsequent to said first time period of a duration 0.5 Tf, and in the same specific sequence of said N Hall effect devices, to each of said N Hall effect devices a respective wiring scheme Wi− is applied, $i=1, \ldots, N$, during respective subsequent time periods of the same durations ti, $i=1, \ldots, N$;
    wherein each of said wiring schemes Wi+ is an orthogonal and reverse wiring scheme of the respective other wiring scheme Wi−, $i=1, \ldots, N$;
    an output unit operationally connected to said output of said filtering-or-resonating unit structured and configured for obtaining from a filtered signal an output signal indicative of said angular orientation and outputting said signal;
    wherein said filtering-or-resonating unit is structured and configured for altering an inputted signal of a fundamental frequency $f=1/Tf$, said inputted signal containing, in addition to said fundamental frequency, higher harmonics, in such a way that an intensity of said higher harmonics is decreased relative to an intensity of said fundamental frequency.

2. Sensor according to claim 1, wherein said specific sequence is a sequence related to or depending on a relative alignment of said detection directions of said Hall effect devices, and wherein said durations ti, $i=1, \ldots, N$, of said time periods are related to or depending on a relative alignment of said detection directions of said Hall effect devices.

3. The sensor according to claim 1, wherein said control unit is furthermore structured and configured for controlling said wiring unit in such a way that after the before-mentioned first and second time periods of a duration 0.5 Tf, the following is accomplished:
    during a third time period of a duration 0.5 Tf, subsequent to said second time period of a duration 0.5 Tf, and in the same specific sequence of said N Hall effect devices, to each of said N Hall effect devices a respective wiring scheme Wi++, i=1, . . . ,N, is applied during respective subsequent time periods of said same durations ti, i=1, . . . ,N; and during a fourth time period of a duration 0.5 Tf, subsequent to said third time period of a duration 0.5 Tf, and in the same specific sequence of said N Hall effect devices, to each of said N Hall effect devices a respective wiring scheme Wi−−, i=1, . . . ,N, is applied during respective subsequent time periods of the same durations ti, i=1, . . . ,N;

wherein each of said wiring schemes Wi++ is an orthogonal and reverse wiring scheme of the respective wiring scheme Wi−−, i=1, . . . ,N;

wherein each of said wiring schemes Wi++ is a non-orthogonal and non-reverse wiring scheme of the respective other wiring scheme Wi+ non-identical with said respective other wiring scheme Wi+, i=1, . . . ,N; and wherein each of said wiring schemes Wi−− is a non-orthogonal and non-reverse wiring scheme of the respective other wiring scheme Wi− non-identical with said respective other wiring scheme Wi−, i=1, . . . ,N.

4. The sensor according to claim 1, wherein said specific sequence is a sequence which can be obtained by plotting said detection directions of said Hall effect devices into the positive-y half-plane of an x-y-coordinate system and ordering the Hall effect devices according to the respective angle enclosed between the detection direction of the respective Hall effect device and the positive x-axis, such that said angles constitute a monotonously increasing or monotonously decreasing series.

5. The sensor according to claim 1, wherein said filtering-or-resonating unit is or comprises a bandpass filter having a quality factor Q of Q=π/2±0.25.

6. The sensor according to claim 1, wherein said control unit is furthermore structured and configured for controlling said wiring unit in such a way that for at least one of said N Hall effect devices the respective pair of connectors of the respective Hall effect device, which is connected to said current source during the respective time period of duration ti, i=1, . . . , N, is wired to said current source already before the beginning of said respective time period, and that this wiring is maintained until and throughout said respective time period; and/or said wiring of the respective pair of connectors of the respective Hall effect device connected to said current source during the respective time period of duration ti, i=1, . . . ,N is maintained throughout said respective time period and until after termination of said respective time period;

is accomplished;

wherein this applies for each said N Hall effect devices, more particularly wherein both is accomplished for each of said N Hall effect devices.

7. The sensor according to claim 1, further comprising an additional, second set of N≧2 Hall effect devices, each Hall effect device of said second set being constructed substantially identical to a respective Hall effect device of said first set, each Hall effect device of said second set being aligned the same way as said respective Hall effect device of said first set, but rotated about an axis perpendicular to said plane by substantially 180° with respect to said respective Hall effect device of said first set;

wherein said control unit is furthermore structured and configured for controlling said wiring unit in such a way that the before-described application of wiring schemes to said pairs of connectors of said Hall effect devices of said first set is simultaneously applied to the respective Hall effect devices of said first set, for the same durations ti, i=1, . . . ,N, and in the same specific sequence as for the respective Hall effect devices of said first set; wherein said filtering-or-resonating unit comprises a subtraction unit having two inputs, for obtaining a difference between signals fed to said inputs, wherein those pairs of connectors of the Hall effect devices of the first and second sets, respectively, which are connected to said filtering-or-resonating unit, are operationally connected to one of said inputs each.

8. The sensor according to claim 1, wherein said output unit is furthermore structured and configured for comparing filtered signals to a non-zero constant signal and deriving from a result of said comparing an additional output signal which is indicative of an amplitude of said projection of said magnetic field vector of said magnetic field into said plane.

9. The sensor according to claim 1, wherein said output unit comprises a phase detection unit and a comparator, in particular wherein said output unit substantially consists of a latch and a comparator and a counter.

10. Integrated circuit comprising at least one sensor according to claim 1, in particular wherein said integrated circuit is manufactured using CMOS processes.

11. Rotational-speed sensor comprising at least one sensor according to claim 1, and an evaluation unit operationally connected to said output unit structured and configured for obtaining an output indicative of a speed of rotation of said projection of said magnetic field vector of said magnetic field into said plane.

12. Revolution counter comprising at least one sensor according to claim 1, and an evaluation unit operationally connected to said output unit structured and configured for obtaining an output indicative of a number of rotations of said projection of said magnetic field vector of said magnetic field into said plane that have taken place from an initial point in time.

13. Method for sensing an angular orientation of a projection of a magnetic field vector of a magnetic field into a plane, said method comprising the steps of a) providing at least a first set of N≧2 Hall effect devices, each having a detection direction and comprising two pairs of connectors, wherein, in presence of said magnetic field, a flow of an electric current between the connectors of any of said pairs of connectors allows to pick up a Hall voltage between the connectors of the other respective pair of connectors induced by said magnetic field, unless a magnetic field component of said magnetic field along said detection direction is zero, wherein said N Hall effect devices are aligned such that their detection directions lie in said plane, and wherein at least two of said Hall effect devices have non-identical detection directions;

b) providing at least one filtering-or-resonating unit comprising an input and structured and configured for altering an inputted signal of a fundamental frequency f=1/Tf, said inputted signal containing, in addition to said fundamental frequency, higher harmonics, in such a way that an intensity of said higher harmonics is decreased relative to an intensity of said fundamental frequency;

c) providing at least one current source comprising an output and capable of outputting an electrical current at its output;

wherein a particular way of wiring both pairs of connectors of a Hall effect device to said output of said current source or to said input of said filtering-or-resonating unit is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;

d1) applying, during a first time period of a duration 0.5 Tf and in a specific sequence of said N Hall effect devices, to each of said N Hall effect devices a respective wiring scheme Wi+, i=1, . . . ,N, during respective subsequent time periods of durations ti, i=1, . . . ,N; and d2) applying, during a second time period of a duration 0.5 Tf, subsequent to said first time period of a duration 0.5 Tf, and in the same specific sequence of said N Hall effect devices, to each of said N Hall effect devices a respective wiring scheme Wi−, i=1, . . . ,N, during respective subsequent time periods of the same durations ti, i=1, . . . ,N;

wherein each of said wiring schemes Wi+ is an orthogonal and reverse wiring scheme of the respective other wiring scheme Wi−, i=1, . . . ,N; and e) deriving from signals outputted by said filtering-or-resonating unit in reaction to carrying out steps d1) and d2) an output signal indicative of said angular orientation.

14. The method according to claim 13, comprising carrying out after step d2) the steps of d3) applying, during a third time period of a duration 0.5 Tf, subsequent to said second time period of a duration 0.5 Tf, and in the same specific sequence of said N Hall effect devices, to each of said N Hall effect devices a respective wiring scheme Wi++, i=1, . . . ,N, during respective subsequent time periods of said same durations ti, i=1, . . . ,N; and d4) applying, during a fourth time period of a duration 0.5 Tf, subsequent to said third time period of a duration 0.5 Tf, and in the same specific sequence of said N Hall effect devices, to each of said N Hall effect devices a respective wiring scheme Wi−−, i=1, . . . ,N, during respective subsequent time periods of said same the same durations ti, i=1, . . . ,N;

wherein each of said wiring schemes Wi++ is an orthogonal and reverse wiring scheme of the respective wiring scheme Wi−−, i=1, . . . ,N; and wherein each of said wiring schemes Wi++ is a non-orthogonal and non-reverse wiring scheme of the respective other wiring scheme Wi+ non-identical with said respective other wiring scheme Wi+, i=1, . . . ,N; and wherein each of said wiring schemes Wi−− is a non-orthogonal and non-reverse wiring scheme of the respective other wiring scheme Wi− non-identical with said respective other wiring scheme Wi−, i=1, . . . ,N.

15. The method according to claim 13, wherein said specific sequence is a sequence which can be obtained by plotting said detection directions of said Hall effect devices into the positive-y half-plane of an x-y-coordinate system and ordering the Hall effect devices according to the respective angle enclosed between the detection direction of the respective Hall effect device and the positive x-axis, such that said angles constitute a monotonously increasing or monotonously decreasing series.

16. The method according to claim 15, wherein said magnetic field is a rotating magnetic field, and said filtering-or-resonating unit is or comprises a bandpass filter having a quality factor Q of Q=π/2±0.25, the method comprising, in case said projection of said magnetic field vector, when plotted into said positive-y half-plane of said x-y-coordinate system, moves towards increasing angles, the step of e1) selecting said specific order such that said angles constitute a monotonously increasing series;

or, in case said projection of said magnetic field vector, when plotted into said positive-y half-plane of said x-y-coordinate system, moves towards decreasing angles, the step of e2) selecting said specific order such that said angles constitute a monotonously decreasing series.

17. The method according to claim 13, comprising for at least one of said N Hall effect devices at least one of the steps of f1) accomplishing said wiring of the respective pair of connectors of the respective Hall effect device, which is connected to said current source during the respective time period of duration ti, i=1, . . . ,N, to said current source already before the beginning of said respective time period and maintaining said wiring until and throughout said respective time period; and f2) maintaining said wiring of the respective pair of connectors of the respective Hall effect device which is connected to said current source during the respective time period of duration ti, i=1, . . . ,N throughout said respective time period and until after termination of said respective time period;

wherein at least one of said steps f1 and f2 is carried out for each said N Hall effect devices, more particularly wherein both said steps f1 and f2 are carried out for each of said N Hall effect devices.

18. The method according to claim 13, further comprising the steps of a') providing an additional, second set of N≧2 Hall effect devices, each Hall effect device of said second set being constructed substantially identical to a respective Hall effect device of said first set, each Hall effect device of said second set being aligned the same way as said respective Hall effect device of said first set, but rotated about an axis perpendicular to said plane by substantially 180° with respect to said respective Hall effect device of said first set;

d') simultaneously to the respective Hall effect devices of said first set and for the same durations ti, i=1, . . . ,N, and in the same specific sequence as the respective Hall effect devices of said first set, applying to each Hall effect device of said second set the same wiring as to said respective Hall effect device of said first set;

g) obtaining a difference between signals fed from the Hall effect devices of said second set to said filtering-or-resonating unit or signals derived therefrom and signals fed from said respective Hall effect devices of said first set to said filtering-or-resonating unit or signals derived therefrom.

19. The method according to claim 13, further comprising the step of h) comparing said signals outputted by said filtering-or-resonating unit in reaction to carrying out steps d1) and d2) to a non-zero constant signal; and i) deriving from a result of said comparing an output signal indicative of an amplitude of said projection of said magnetic field vector of said magnetic field into said plane.

20. Sensor for sensing an angular orientation of a projection of a magnetic field vector of a magnetic field into a plane, said sensor comprising
- at least a first and a second Hall effect devices each having a detection direction, said detection directions of said first and a second Hall effect devices being aligned with respect to each other in a non-parallel fashion, said Hall effect devices each comprising two pairs of connectors, wherein, in presence of said magnetic field, a flow of an electric current between the connectors of any of said pairs of connectors allows to pick up a Hall voltage between the connectors of the other respective pair of connectors induced by said magnetic field unless a magnetic field component of said magnetic field along said detection direction is zero;
- at least one filtering-or-resonating unit comprising an input and an output;
- at least one current source comprising an output for outputting an electrical current at its output;
- a wiring unit operationally connected to each of said connectors of each of said Hall effect devices structured and configured for selectively wiring said pairs of connectors to said output of said current source or to said input of said filtering-or-resonating unit, wherein a particular way of wiring both pairs of connectors of a Hall effect device is referred to as a "wiring scheme", wherein two wiring schemes are referred to as "orthogonal" wiring schemes if a pair of connectors connected to the current source in one of the two wiring schemes is connected to said filtering-or-resonating unit in the other of the two wiring schemes, and wherein two wiring schemes are referred to as "reverse" wiring schemes if they lead to different signs of the Hall voltage;
- a control unit structured and configured for controlling said wiring unit in such a way that
  - for a duration of a duration Tf/4 a first wiring scheme is applied to said at least one first Hall effect device, and subsequently,
  - for a duration of a duration Tf/4, a second wiring scheme is applied to said second Hall effect device, and subsequently,
  - for a duration of a duration Tf/4, a third wiring scheme is applied to said first Hall effect device, and subsequently,
  - for a duration of a duration Tf/4, a fourth wiring scheme is applied to said second Hall effect device;
  - wherein said first and third wiring schemes are orthogonal and reverse wiring schemes; and
  - wherein said second and fourth wiring schemes are orthogonal and reverse wiring schemes;
- an output unit operationally connected to said output of said filtering-or-resonating unit structured and configured for obtaining from a signal outputted from said filtering-or-resonating unit an output signal indicative of said angular orientation and for outputting said signal;
- wherein said filtering-or-resonating unit is structured and configured for filtering an inputted signal of a fundamental frequency f=1/Tf containing, in addition to said fundamental frequency, higher harmonics in such a way that an intensity of said higher harmonics is decreased relative to an intensity of said fundamental frequency.

* * * * *